(12) United States Patent
Chen et al.

(10) Patent No.: US 7,270,707 B2
(45) Date of Patent: Sep. 18, 2007

(54) METHOD FOR THE PREPARATION OF DIAMOND, GRAPHITE OR THEIR MIXTURE

(75) Inventors: Qianwang Chen, Anhui (CN); Yitai Qian, Anhui (CN); Zhengsong Lou, Anhui (CN)

(73) Assignee: University of Science and Technology of China, Anhui (CN)

( * ) Notice: Subject to any disclaimer, the term of this patent is extended or adjusted under 35 U.S.C. 154(b) by 300 days.

(21) Appl. No.: 10/534,671

(22) PCT Filed: Nov. 15, 2002

(86) PCT No.: PCT/CN02/00811
§ 371 (c)(1),
(2), (4) Date: May 12, 2005

(87) PCT Pub. No.: WO2004/046032
PCT Pub. Date: Jun. 3, 2004

(65) Prior Publication Data
US 2006/0011127 A1    Jan. 19, 2006

(51) Int. Cl.
*C30B 29/04* (2006.01)
(52) U.S. Cl. ........................................ 117/85
(58) Field of Classification Search ............ 117/10
See application file for complete search history.

(56) References Cited

U.S. PATENT DOCUMENTS 2,947,617 A * 8/1960 Wentorf, Jr. ................ 51/307
4,030,965 A * 6/1977 Hammond et al. ......... 423/497
4,404,177 A * 9/1983 Derbyshire et al. ........... 117/10

FOREIGN PATENT DOCUMENTS

| DE | 3612340 A | 10/1987 |
| JP | 1148790 A | 6/1989 |
| JP | 1246116 A | 10/1989 |

* cited by examiner

*Primary Examiner*—Robert Kunemund
*Assistant Examiner*—Marissa W. Chaet
(74) *Attorney, Agent, or Firm*—Westman, Champlin & Kelly P.A.

(57) ABSTRACT

The present invention provides a method of preparation for diamond, graphite or mixtures of diamond and graphite by reduction of CO or $CO_2$. Said method comprises a step of contacting an active metal capable of reducing a carbon source into elementary carbon with carbon source (such as CO and/or $CO_2$ and/or their origin) under conditions suitable to reduce the carbon source to elementary carbon in the course of a reduction reaction. After the raw diamond or mixtures of diamond and graphite thus obtained are subjected to intensive heat treatment with perchloric acid, pure diamond granules are obtained. The present method employs relatively low reaction temperature and pressure and the facilities needed in the method are simple and easy to operate. Diamond finally obtained has good crystallinity and free of impurities with granule size of several hundred micrometer. In addition, the present invention makes use of the industrial by-product of CO and $CO_2$ which not only turns wastes into valuables and is low in cost, but also improves the environment and thus possesses both good social benefits and economical benefits.

10 Claims, 2 Drawing Sheets

METHOD FOR THE PREPARATION OF DIAMOND, GRAPHITE OR THEIR MIXTURE

CROSS-REFERENCE TO RELATED APPLICATION

This Application is a Section 371 National Stage Application of International Application No. PCT/CN2002/000811, filed Nov. 15, 2002 and published as WO 2004/046032 A1 on Jun. 3, 2004, and published in Chinese, the content of which is hereby incorporated by reference in its entirety.

FIELD OF INVENTION

The present invention relates to a process for preparing diamond, graphite or mixtures of diamond and graphite from CO or $CO_2$ served as the carbon source by reduction with active metals.

BACKGROUND OF THE INVENTION

Diamond has the advantages of high melting point, low compressibility coefficient, high symmetry and high refractive index. It has wide applications in industrial manufacture and scientific research. Owing to the specific properties and uses thereof, quite long ago, people tried to prepare it by chemical method in order to supplement the insufficiency of the natural storage. A large amount of time and a long course of events have been spent on solving a series of problems such as the exploration of transition condition and relevant facilities as well as searches for an effective catalyst. In 1954, first work on successful preparation of diamond by conversion of graphite under strict control of high temperature and high pressure with FeS used as the flux was reported in Nature, Vol. 176, 51. Thereafter research and production of man-made diamond have been developing rapidly and grows to be a new industry. The conventional method of preparation for diamond involves the use of graphite as the raw material, molten metals (Ni, Cr, Mn, Fe, Co, Ti, Al etc) as the catalyst and flux, little diamond particles as crystal seeds. Thus graphite is converted into diamond under pressure of 5-100 kbar and high temperature of 1200-2400K. This kind of method has to endure critical conditions and very high cost.

Chinese patent 97119450.5 and Science, 1998, Vol. 281, 246 disclosed a method in which $CCl_4$ was used as the carbon source, Na was used as the reducing agent and solvent, Ni—Co metal was used as the catalyst. $CCl_4$ could be converted into diamond at 700° C. The size of the diamond particles thus prepared was less than 0.2 micrometer and the method had the danger of explosion. Therefore at the moment, the method is not suitable for large-scale industrial production of diamond.

On the other side, the global storage of $CO_2$ on earth is extremely abundant. $CO_2$ is also the by-product of exhaust emission of many industrial manufactures. When $CO_2$ is expelled into air, "greenhouse effect" will be induced which will cause the global weather getting warmer. As a result, many countries in the world have to spend huge amount of manpower and resources to bring it under control. $CO_2$ is non-toxic and cheap. Utilization of $CO_2$ as main raw material for synthesizing inorganic and organic compounds is one of the objectives of chemists. It is regrettable to notice that up to now no any well-industrialized method of treatment that uses $CO_2$ as raw material in huge amount has been reported.

SUMMARY OF THE INVENTION

The objective of the present invention is to provide a method for the preparation of diamond, graphite or mixtures of diamond and graphite by using $CO_2$ (or compound that could release $CO_2$ on decomposition) or CO (or CO source) as the carbon source and active metals as the reducing agents.

In order to realize the above-mentioned objective, the inventor of present invention carried out a large amount of intensive investigations and found that $CO_2$ or $CO_2$ source and CO or CO source could react with active metal that is capable of reducing them into elementary carbon to form diamond, graphite or mixture of diamond and graphite.

Hence the present invention provides a method for preparing diamond, graphite or mixture of diamond and graphite. The method includes the steps in which active metals (capable of reducing carbon source into elementary carbon) under reducing conditions capable of reducing carbon source into elementary carbon are brought in contact with carbon source (CO and/or CO source and/or $CO_2$ and/or $CO_2$ source) to start a reduction reaction. The carbon source is preferably $CO_2$ and/or $CO_2$ source.

In the method of the present invention based on a preferred approach, $CO_2$ is used as the carbon source and is reduced by active metal to form diamond. Therefore any compound, such as dry ice, oxalates, carbonates or their mixture that could release $CO_2$ on decomposition as well as $CO_2$ itself could be used as a carbon source to prepare diamond.

Any metal that is capable of reducing CO or $CO_2$ into elementary carbon could be used as an active metal in the present invention. Metals whose standard electrode potentials are lower than −2.2 V are preferred. Such metals include (but not limited to) one or mixture of several of the following: metal Na, Li, K, Rb, Cs, or Mg, Ca, Sr, Ba. Although not wished to be bound by any theory, it is generally believed that standard electrode potential of $CO_2$/$CO_2^{·-}$ in aprotic solvent is −2.2 V. $CO_2^{·-}$ is an active single electron free radical that reacts easily with $CO_2$ to form C—C linkage. Therefore those metals having standard electrode potential lower than −2.2 V, such as the standard electrode potential of Na is −2.7 V, the standard electrode potential of K is −2.931 V, the standard electrode potential of Li is −3.04 V, the standard electrode potential of Mg is −2.37 V, could all be used to reduce $CO_2$ to prepare diamond or mixtures of diamond and graphite.

Temperature of reduction reaction suitable to be used in the present invention is preferably 300° C. at least, preferably 300-2000° C. Specific temperature of reaction to be adopted would depend on the selected pressure condition and the selected active metal used. When metal Na or Li, K, Rb, Cs is used as reducing metal, reaction temperature is preferably 300° C. at least, more preferably 300-2000° C.; When Mg, Ca, Sr, Ba is used as reducing metal, reaction temperature is preferably 650° C. at least, more preferably 650-2000° C;

Pressure of reduction reaction suitable to be used in the present invention is 0.2 kbar at least, preferably 0.2-5.0 kbar. Specific pressure of reaction to be adopted would depend on what kind of elementary carbon product expected to be prepared and on the temperature selected. It should be emphasized that when diamond of high purity is expected to be synthesized, higher pressure is preferably adopted, more preferably higher pressure is maintained throughout the whole course of reaction.

Under higher pressure, the product obtained is diamond with high density; If the reaction is carried out in a reaction kettle that could not maintain higher pressure automatically, pressure of the system will drop in the course of reaction and the main product formed at that time will be graphite of lower density and the final product will be a mixture of graphite and diamond. Under higher temperature and higher pressure, said reaction route is as follows;

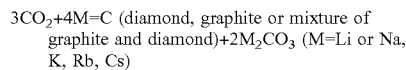

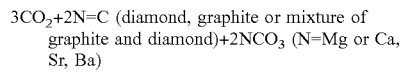

The thermodynamic property of diamond determines that a definite pressure is necessary for the formation of diamond. The higher the pressure is, the more favorable the formation of diamond will be. In the method of the present invention, it is possible to vary the pressure of the reaction system by controlling the amounts of dry ice, oxalate, carbonate or $CO_2$ gas added. Experiments prove that when temperature is lower than 300° C. and pressure is lower than 0.2 kbar, no diamond will be formed. Judging the tolerance of the common reaction kettle, it is appropriate to carry out the reaction at a temperature of 300-2000° C. and a pressure of 0.2-5.0 kbar.

Reduction reaction of the present invention is preferably carried out under a supercritical condition. It is believed that when $CO_2$ is heated to exceed its critical point (for example, 31.5° C., 73 kbar), its gas phase and liquid phase will turn into a single supercritical phase having high mixing rate and relatively weaker intermolecular association power. This will induce the supercritical $CO_2$ to possess high reactivity. Many physico-chemical properties of the supercritical $CO_2$ lie between gas and liquid and possess the advantages of both two. For instance, it possesses dissolution power and heat conductivity coefficient similar to liquid and viscosity coefficient and diffusion coefficient similar to gas. In the preferred approach of the present invention, temperature and pressure are adjusted to turn the $CO_2$ of the reaction system into supercritical state.

Based on the method of the present invention, time of the reduction reaction is determined by temperature, pressure and reducing power of the reducing metal adopted. 10-48 hours are preferred.

After the completion of the reaction, the reaction system is cooled to room temperature, and pressure is lowered to atmospheric pressure and diamond, graphite or their mixture could be obtained.

If small diamond granule, such as 300 μm-sized diamond granule, is added to the above-mentioned reaction system as a crystal seed, up to 6000 μm-sized diamond granule could be obtained. For the sake of convenience and lowering cost, reaction product of the preceding experiment is preferably selected as the crystal seed.

In order to obtain pure diamond, diamond or mixture of diamond and graphite obtained by the method of the present invention could be purified by any conventional purification method. For instance, it is possible to obtain pure diamond particulate through intensive heat treatment with perchloric acid or sedimentation separation with 0.5% aqueous solution of gum Arabic.

If only graphite is to be prepared, reaction could be carried out merely at pressure lower than 0.2 kbar.

The present invention utilizes industrial by-product $CO_2$ or CO or compounds capable of releasing CO or $CO_2$ on decomposition as the main raw material and thus possesses the advantages of low reaction temperature, good dispersion and good flowability of carbon source. Diamond crystals obtained have good crystallinity, contains no impurities and could have size up to several hundred micrometers. If small diamond granule, such as 300 μm-sized diamond granule, is added to the above-mentioned reaction system as a crystal seed, diamond granule with size of 3000 μm or even up to 6000 μm could be obtained.

Especially when $CO_2$ is used as the carbon source, the approach has the following advantages: $CO_2$ is the by-product of exhaust emission of many industrial manufactures. When $CO_2$ is expelled into air, "greenhouse effect" will be induced which will cause the global weather getting warmer. As a result, many countries in the world have to spend huge amount of manpower and resources to bring it under control. The present invention uses $CO_2$ as the raw material to prepare diamond, graphite or their mixture. Thus this approach not only could turn wastes into valuables and could perform it at low cost but also it is beneficial to the improvement of environment and thus possesses good social benefit and economic benefit. The present invention could also be used to reduce $CO_2$ into graphite that is also an important industrial raw material. Using $CO_2$ as a reactant has advantages of non-toxicity, non-combustion and safe handling. In addition, $CO_2$ could easily be separated from the reactant and thus by lowering the pressure, $CO_2$ turns into gas and then is expelled and the final product could conveniently and directly be obtained.

In comparison with the conventional method of preparation for diamond, the present method uses lower temperature, pressure, simpler facility and is of low cost and easily manipulative. When compared with method of reduction of $CCl_4$ into diamond, the present method is safer in manipulation, could yield diamond of larger size and thus possesses significance of practical industrial production and potential wide markets.

BRIEF DESCRIPTION OF THE DRAWINGS

FIG. 3b is a magnified profile for the portion selected by the square in FIG. 3a.

DETAILED DESCRIPTION OF THE PREFERRED EMBODIMENTS

EXAMPLE 1

2.0 g of metal sodium of chemical pure grade and 8.0 g of self-prepared dry ice were put into an autoclave of a capacity of 12 mL. The autoclave was heated to 440° C. so that the pressure in the autoclave reached 500-1000 kbar and this state was maintained for 16 hrs. Then the autoclave was cooled to room temperature and the pressure in the autoclave dropped to atmospheric pressure. The reaction product was treated with HCl and washed with water. 0.20 g of black powder was obtained.

Figure 1:
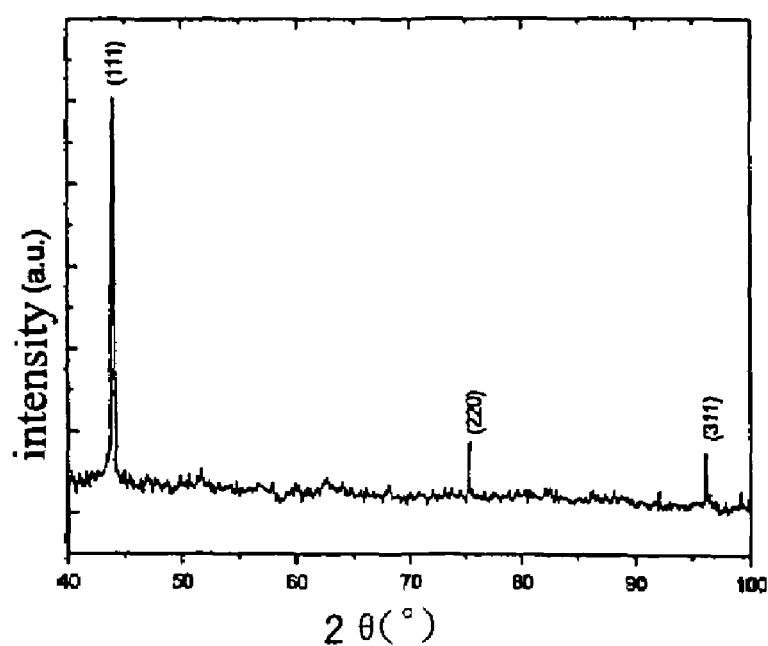
FIG. 1 is the X-ray diffraction profile for the sample obtained in Example 1.

The X-ray diffraction spectrum of the sample was measured. In the diffraction spectrum (FIG. 1) of the sample obtained, there appeared 3 characteristic diffraction peaks of cubic phase diamond (JCPDS card No. 6-675) and 1 rather broad diffraction peak of graphite at 26.2°.

Figure 2:
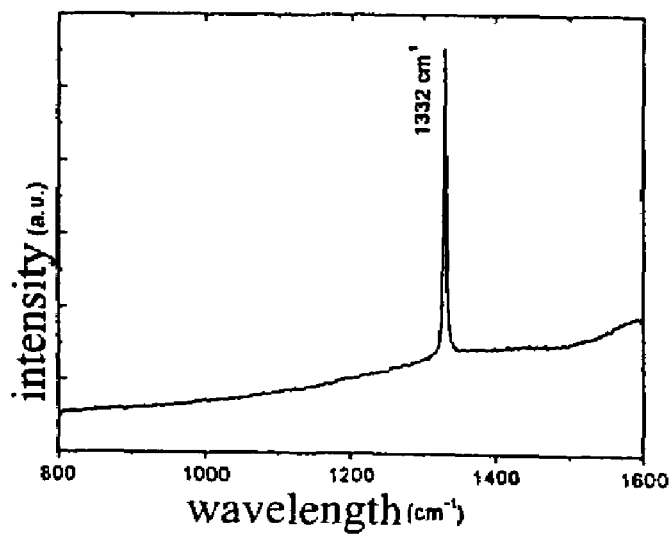
FIG. 2 is the Raman spectrum for the sample obtained in Example 1.

Raman spectrum of the sample was measured. In the spectrum, there was a characteristic peak of diamond at 1332 $cm^{-1}$ (FIG. 2, 1332 $cm^{-1}$ is the characteristic peak of diamond, see Nature 1999, Vol. 402, 164) with its half-height width of 4.7 $cm^{-1}$ close to that of natural diamond (2.5 $cm^{-1}$), which indicating that the diamond synthesized has good crystallinity. In addition there were two characteristic peaks of graphite at 1363 $cm^{-1}$ and 1591 $cm^{-1}$ respectively indicating that the product was a mixture of diamond and graphite.

Figure 3A:
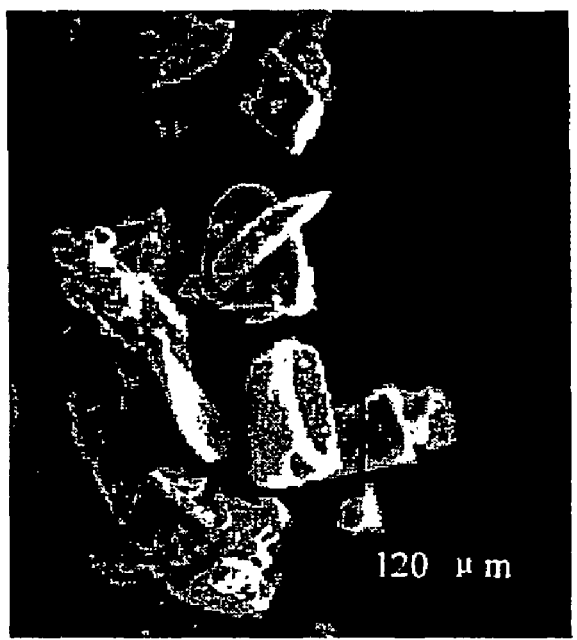
FIG. 3a, 3b are SEM (scanning electronic micrograph) profiles for the diamond sample obtained in Example 1.
Figure 3B:

The mixed powder obtained was intensively heat-treated with perchloric acid at 160° C. and 0.018 g of pure diamond granule was finally obtained. SEM micrograph indicated that the average diameter of the diamond granule was 100 μm (FIG. 3).

If the metal sodium of the present example was replaced by Li, K, Rb, Cs as the reducing metal, mixtures of diamond and graphite were similarly obtained.

EXAMPLE 2

2.5 g of potassium of chemical pure grade was put into an autoclave. Said autoclave was heated to 470° C. and $CO_2$ gas was fed into an autoclave under pressure to 400-1500 kbar and this state was maintained for 12 hrs. Then the autoclave was cooled to room temperature and the pressure in the autoclave dropped to atmospheric pressure. The reaction product was treated with HCl and washed with water. 0.22 g of black powder was obtained.

X-ray diffraction pattern and Raman spectrum of the sample were measured and the obtained sample was proved to be a mixture of diamond and graphite.

The mixed powder obtained was separated by sedimentation in 0.5% aqueous solution of gum Arabic and 0.02 g of pure diamond granule was finally obtained. SEM micrograph indicated that the average diameter of the diamond granule was 120 μm and the maximum diameter could reach 300 μm.

If potassium of the present example was replaced by Li, Na, Rb, Cs as the reducing metal, mixture of diamond and graphite was similarly obtained.

EXAMPLE 3

2.2 g of potassium of chemical pure grade and 6.0 g of $MgCO_3$ were put into an autoclave of 12 mL that was heated to 500° C. and to a pressure of 800-2000 kbar and this state was maintained for 18 hrs. Then the autoclave was cooled to room temperature and the pressure in the autoclave dropped to atmospheric pressure. 0.08 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule with average diameter of the diamond granule of 260 μm (determined by SEM) was obtained.

If potassium of the present example was replaced by Li, Na, Rb, Cs as the reducing metal, mixtures of diamond and graphite were similarly obtained.

If $MgCO_3$ of the present example was replaced by $Ag_2CO_3$, $CaCO_3$, $CdCO_3$, $CoCO_3$, $CuCO_3$, $FeCO_3$, $BaCO_3$, $MnCO_3$, $NiCO_3$, $PbCO_3$, $SrCO_3$, $ZnCO_3$, $Na_2CO_3$, $K_2CO_3$, $Li_2CO_3$ and the temperature was changed to 470° C., 950° C., 500° C., 450° C., 480° C., 520° C., 1000° C., 460° C., 550° C., 540° C., 900° C., 440° C., 1500° C., 1400° C., 750° C. respectively, a mixture of diamond and graphite was similarly obtained.

EXAMPLE 4

2.2 g of Li of chemical pure grade and 14.0 g of $NiC_2O_4$ were put into an autoclave of 12 mL which was heated to 560° C. and to a pressure of 500-1000 kbar and this state was maintained for 12 hrs. Then the autoclave was cooled to room temperature and the pressure in the autoclave dropped to atmospheric pressure. The reaction product was treated with HCl and washed with water. 0.28 g of black powder was obtained.

X-ray diffraction pattern and Raman spectrum of the sample were measured and the obtained sample was proved to be a mixture of diamond and graphite.

The mixed powder obtained was intensively heat treated with perchloric acid at 160° C. and pure diamond granule with average diameter of the diamond granule of 100 μm (determined by SEM) was obtained.

If Li of the present example was replaced by K, Na, Rb, Cs as the reducing metal, a mixture of diamond and graphite was similarly obtained.

If $NiC_2O_4$ of the present example was replaced by $CaC_2O_4$, $CdC_2O_4$, $CoC_2O_4$, $CuC_2O_4$, $CrC_2O_4$, $FeC_2O_4$, $K_2C_2O_4$, $MnC_2O_4$, $La_2(C_2O_4)_3$, $Li_2C_2O_4$, $MgC_2O_4$, $Na_2C_2O_4$, $PbC_2O_4$, $SrC_2O_4$, $ZnC_2O_4$, $La_2(C_2O_4)_3$, $Cr_2(C_2O_4)_3$, a mixture of diamond and graphite was similarly obtained.

EXAMPLE 5

2.5 g of Mg of chemical pure grade was put into an autoclave of 12 mL. The autoclave was heated to 650° C. and $CO_2$ gas was fed into an autoclave under pressure to 500-1500 kbar and this state was maintained for 12 hrs. Then the autoclave was cooled to room temperature and the pressure in the autoclave dropped to atmospheric pressure. The reaction product was treated with HCl and washed with water. 0.23 g of black powder was obtained.

X-ray diffraction pattern and Raman spectrum of the sample were measured and the obtained sample was proved to be a mixture of diamond and graphite.

The mixed powder obtained was intensively heat treated with perchloric acid and a pure diamond granule was finally obtained. SEM micrograph indicated that the average diameter of the diamond granule was 60 μm.

If Mg of the present example was replaced by Ca, Sr, Ba as the reducing metal and temperature was changed to 850° C., 800° C. and 750° C. respectively, mixture of diamond and graphite was similarly obtained.

EXAMPLE 6

2.5 g of Ca of chemical pure grade and 8.0 g of self-prepared dry ice were put into an autoclave of capacity of 12 mL. The autoclave was heated to 850° C. so that the pressure in the autoclave reached 500-1000 kbar and this state was maintained for 16 hrs. Then the autoclave was cooled to room temperature and the pressure in the autoclave dropped to atmospheric pressure. The reaction product was treated with HCl and washed with water. 0.20 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule was finally obtained. SEM micrograph indicated that the average diameter of the diamond granule was 130 μm.

If Mg of the present example was replaced by Ca, Sr, Ba as the reducing metal and temperature was changed to 850° C., 800° C. and 750° C. respectively, mixture of diamond and graphite was similarly obtained.

EXAMPLE 7

2.0 g of Mg of chemical pure grade and 14.0 g of $CoC_2O_4$ were put into an autoclave of 12 mL which was heated to 650° C. and to a pressure of 500-1000 kbar and this state was maintained for 16 hrs. Then the autoclave was cooled to room temperature and the pressure in the autoclave dropped to atmospheric pressure. The reaction product was treated with HCl and washed with water. 0.20 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule with average diameter of the diamond granule of 50 μm (determined by SEM) was obtained.

If Mg of the present example was replaced by Ca, Sr, Ba as the reducing metal and the temperature was changed to 850° C., 750° C., 800° C., mixture of diamond and graphite was similarly obtained.

If $CoC_2O_4$ of the present example was replaced by $CaC_2O_4$, $CdC_2O_4$, $NiC_2O_4$, $CuC_2O_4$, $CrC_2O_4$, $FeC_2O_4$, $K_2C_2O_4$, $MnC_2O_4$, $La_2(C_2O_4)_3$, $Li_2C_2O_4$, $MgC_2O_4$, $Na_2C_2O_4$, $PbC_2O_4$, $SrC_2O_4$, $ZnC_2O_4$, mixture of diamond and graphite was similarly obtained.

EXAMPLE 8

3.5 g of Sr of chemical pure grade and 16.0 g of $FeCO_3$ were put into an autoclave of 12 mL which was heated to 800° C. and to a pressure of 500-1500 kbar and this state was maintained for 16 hrs. Then the autoclave was cooled to room temperature and the pressure in the autoclave dropped to atmospheric pressure. The reaction product was treated with HCl and washed with water. 0.28 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule with average diameter of the diamond granule of 100 μm (determined by SEM) was obtained.

If Sr of the present example was replaced by Ca, Mg, Ba as the reducing metal and the temperature was changed to 850° C., 650° C., 800° C., mixture of diamond and graphite was similarly obtained.

If $FeCO_3$ of the present example was replaced by $CaCO_3$, $CdCO_3$, $CoCO_3$, $CuCO_3$, $MgCO_3$, $BaCO_3$, $MnCO_3$, $NiCO_3$, $PbCO_3$, $SrCO_3$, $ZnCO_3$, $Na_2CO_3$, $K_2CO_3$, $Li_2CO_3$ and the temperature was changed to 950° C., 820° C., 840° C., 880° C., 860° C., 1000° C., 860° C., 850° C., 840° C., 900° C., 940° C., 1500° C., 1400° C., 850° C., mixture of diamond and graphite was similarly obtained.

EXAMPLE 9

2.2 g of K of chemical pure grade was put into an autoclave and a diamond seed of size of 300 μm was added. The autoclave was heated to 520° C. and $CO_2$ gas was fed into autoclave under pressure to 500-1500 kbar and this state was maintained for 16 hrs. Then the autoclave was cooled to room temperature and the pressure in the autoclave dropped to atmospheric pressure. The reaction product was treated with HCl and washed with water. 0.24 g of black powder was obtained.

X-ray diffraction pattern and Raman spectrum of the sample were measured and the obtained sample was proved to be a mixture of diamond and graphite.

The mixed powder obtained was intensively heat treated with perchloric acid and a pure diamond granule was finally obtained. SEM micrograph indicated that the average diameter of the diamond granule was 430 μm.

If K of the present example was replaced by Li, Na, Rb, Cs as the reducing metal, mixture of diamond and graphite was similarly obtained.

EXAMPLE 10

3.2 g of Cs of chemical pure grade and 8.0 g of self-prepared dry ice were put into an autoclave of a capacity of 12 mL and a diamond seed of 300 μm was also added. After the autoclave was heated to 300° C., $CO_2$ gas was fed under pressure, so that the pressure in the autoclave reached 200-1500 kbar and this state was maintained for 16 hrs. Then the autoclave was cooled to room temperature and the pressure in the autoclave dropped to atmospheric pressure. The reaction product was treated with HCl and washed with water. 0.12 g of black powder was obtained.

X-ray diffraction pattern and Raman spectrum of the sample were measured and the obtained sample was proved to be a mixture of diamond and graphite.

The mixed powder obtained was intensively heat treated with perchloric acid and a pure diamond granule was finally obtained. SEM micrograph indicated that the average diameter of the diamond granule was 300 μm.

If Cs of the present example was replaced by Li, Na, Rb, K as the reducing metal and temperature was changed to 450° C., 520° C., 480° C. and 580° C. respectively, mixture of diamond and graphite was similarly obtained.

EXAMPLE 11

2.2 g of potassium of chemical pure grade, 6.0 g of $MgCO_3$ and diamond seed of 300 μm were put into an autoclave of 12 mL which was heated to 500° C. and to a pressure of 800-1000 kbar and this state was maintained for 18 hrs. Then the autoclave was cooled to room temperature and the pressure in the autoclave dropped to atmospheric pressure. The reaction product was treated with HCl and washed with water. 0.10 g of black powder was obtained.

X-ray diffraction pattern and Raman spectrum of the sample were measured and the obtained sample was proved to be a mixture of diamond and graphite.

The mixed powder obtained was intensively heat treated with perchloric acid and a diamond granule with average diameter of 270 μm (determined by SEM) was obtained.

If potassium of the present example was replaced by Li, Na, Rb, Cs as the reducing metal, mixture of diamond and graphite was similarly obtained.

If $MgCO_3$ of the present example was replaced by $CaCO_3$, $CdCO_3$, $CoCO_3$, $CuCO_3$, $FeCO_3$, $BaCO_3$, $MnCO_3$, $NiCO_3$, $PbCO_3$, $SrCO_3$, $ZnCO_3$, $Na_2CO_3$, $K_2CO_3$, $Li_2CO_3$ and the temperature was changed to 950° C., 500° C., 450° C., 480° C., 520° C., 1000° C., 460° C., 550° C., 540° C., 900° C., 440° C., 1500° C., 1400° C., 750° C. respectively, mixture of diamond and graphite was similarly obtained.

EXAMPLE 12

2.2 g of Na of chemical pure grade, 16.0 g of $NiC_2O_4$ and diamond seed of 300 µm were put into an autoclave of 12 mL which was heated to 480° C. and to a pressure of 500-1000 kbar and this state was maintained for 18 hrs. Then the autoclave was cooled to room temperature and the pressure in the autoclave dropped to atmospheric pressure. The reaction product was treated with HCl and washed with water. 0.26 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule with average diameter of the diamond granule of 360 µm was obtained.

If Na of the present example was replaced by Li, Na, Rb, Cs as the reducing metal, mixtures of diamond and graphite were similarly obtained.

If $NiC_2O_4$ of the present example was replaced by $CaC_2O_4$, $CdC_2O_4$, $CoC_2O_4$, $CuC_2O_4$, $CrC_2O_4$, $FeC_2O_4$, $K_2C_2O_4$, $MnC_2O_4$, $La_2(C_2O_4)_3$, $Li_2C_2O_4$, $MgC_2O_4$, $Na_2C_2O_4$, $PbC_2O_4$, $SrC_2O_4$, $ZnC_2O_4$, mixture of diamond and graphite was similarly obtained. Oxalates that could release $CO_2$ on decomposition could also be used as the carbon source for producing a diamond.

EXAMPLE 13

2.5 g of Mg of chemical pure grade and reaction product of Example 2 (used as a seed) were put into an autoclave. The autoclave was heated to 650° C. and $CO_2$ gas was fed into autoclave under pressure to 500-1500 kbar and this state was maintained for 12 hrs. Then the autoclave was cooled to room temperature and the pressure in the autoclave dropped to atmospheric pressure. The reaction product was treated with HCl and washed with water. 0.24 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule was finally obtained. SEM micrograph indicated that the average diameter of the diamond granule was 3200 µm.

If Mg in the present example was replaced by Ca, Sr, Ba as the reducing metal and the temperature was changed to 860° C., 840° C., 780° C., mixture of diamond and graphite was similarly obtained.

EXAMPLE 14

2.0 g of Sr of chemical pure grade, 8.0 g of self-prepared dry ice and diamond seed of 300 µm were put into an autoclave of a capacity of 12 mL. The autoclave was heated to 800° C. so that the pressure in the autoclave reached 500-1000 kbar and this state was maintained for 16 hrs. Then the autoclave was cooled to room temperature and the pressure in the autoclave dropped to atmospheric pressure. The reaction product was treated with HCl and washed with water. 0.21 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule was finally obtained. SEM micrograph indicated that the average diameter of the diamond granule was 1100 µm.

If Sr of the present example was replaced by Ca, Mg, Ba as the reducing metal and temperature was changed to 880° C., 680° C. and 820° C. respectively, mixtures of diamond and graphite were similarly obtained.

EXAMPLE 15

2.0 g of Mg of chemical pure grade, 14.0 g of $FeC_2O_4$ and diamond seed of 300 µm were put into an autoclave of 12 mL which was heated to 700° C. and to a pressure of 500-1000 kbar and this state was maintained for 16 hrs. Then the autoclave was cooled to room temperature and the pressure in the autoclave dropped to atmospheric pressure. The reaction product was treated with HCl and washed with water. 0.20 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule with average diameter of 800 µm was obtained.

If Mg of the present example was replaced by Ca, Sr, Ba as the reducing metal and the temperature was changed to 860° C., 840° C., 780° C., mixture of diamond and graphite was similarly obtained.

If $FeC_2O_4$ of the present example was replaced by $CaC_2O_4$, $CdC_2O_4$, $CoC_2O_4$, $CuC_2O_4$, $CrC_2O_4$, $NiC_2O_4$, $K_2C_2O_4$, $MnC_2O_4$, $La_2(C_2O_4)_3$, $Li_2C_2O_4$, $MgC_2O_4$, $Na_2C_2O_4$, $PbC_2O_4$, $SrC_2O_4$, $ZnC_2O_4$, mixture of diamond and graphite was similarly obtained.

EXAMPLE 16

2.0 g of Ca of chemical pure grade, 16.0 g of $FeCO_3$ and diamond seed of 300 µm were put into an autoclave of 12 mL which was heated to 850° C. and to a pressure of 500-1000 kbar and this state was maintained for 16 hrs. Then the autoclave was cooled to room temperature and the pressure in the autoclave dropped to atmospheric pressure. The reaction product was treated with HCl and washed with water. 0.20 g of black powder was obtained.

X-ray diffraction pattern and Raman spectrum of the sample were measured and the obtained sample was proved to be a mixture of diamond and graphite.

The mixed powder obtained was intensively heat treated with perchloric acid and pure diamond granule with an average diameter of 1600 µm (determined by SEM) was obtained.

If Ca of the present example was replaced by Mg, Sr, Ba as the reducing metal and the temperature was changed to 660° C., 880° C., 820° C., mixtures of diamond and graphite were similarly obtained.

If $FeCO_3$ of the present example was replaced by $CaCO_3$, $CdCO_3$, $CoCO_3$, $CuCO_3$, $MgCO_3$, $BaCO_3$, $MnCO_3$, $NiCO_3$, $PbCO_3$, $SrCO_3$, $ZnCO_3$, $Na_2CO_3$, $K_2CO_3$, $Li_2CO_3$ and the temperature was changed to 950° C., 860° C., 870° C., 880° C., 920° C., 1000° C., 860° C., 950° C., 850° C., 900-C, 880° C., 1500° C., 1400° C., 850° C., respectively, mixture of diamond and graphite was similarly obtained.

The invention claimed is:

1. A method of preparation for diamond, graphite or mixtures of diamond and graphite, comprising a step of contacting an active metal capable of reducing carbon source to elementary carbon with a carbon source of CO and/or $CO_2$ and/or its origin under conditions enough to reduce carbon source into elementary carbon so as to carry out a reduction reaction.

2. The method as claimed in claim 1, wherein said carbon source is $CO_2$ or $CO_2$ source or their mixtures.

3. The method as claimed in claim 2, wherein said $CO_2$ includes dry ice and said $CO_2$ source includes oxalates, carbonates or their mixtures.

4. The method as claimed in claim 2, wherein said active metal is a metal having standard electrode potential lower than −2.2 V.

5. The method as claimed in claim 4, wherein said active metals are at least one selected from a group consisting of Na, Li, K, Rb, Cs, Mg, Ca, Sr and Ba.

6. The method as claimed in claim 5, wherein when said active metals are at least one selected from a group consisting of Na, Li, K, Rb and Cs, the temperature of the reduction reaction should at be at least 300° C.; when said active metal is at least one selected from a group consisting of Mg, Ca, Sr and Ba, the temperature of the reduction reaction should be at least 650° C.

7. The method as claimed in claim 1, wherein the pressure of the reduction reaction should be at least 0.2 kbar.

8. The method as claimed in claim 1, further comprising a step of adding diamond particulate as crystal seed into the reaction system before the start of the reaction.

9. The method as claimed in claim 1, further comprising a step of subjecting raw diamond or mixture of diamond and graphite to a purification process to yield pure diamond granules.

10. The method as claimed in claim 9, wherein said purification processes could be carried out either by intensive heat treatment with perchloric acid or by sedimentation separation in aqueous solution of gum Arabic.

* * * * *